(12) United States Patent
Shen et al.

(10) Patent No.: US 8,848,453 B2
(45) Date of Patent: Sep. 30, 2014

(54) INFERRING THRESHOLD VOLTAGE DISTRIBUTIONS ASSOCIATED WITH MEMORY CELLS VIA INTERPOLATION

(75) Inventors: Zhenlei Shen, Boise, ID (US); William H. Radke, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 208 days.

(21) Appl. No.: 13/600,563

(22) Filed: Aug. 31, 2012

(65) Prior Publication Data
US 2014/0063975 A1 Mar. 6, 2014

(51) Int. Cl.
*G11C 16/04* (2006.01)
(52) U.S. Cl.
USPC ............ 365/185.24; 365/185.02; 365/185.03; 365/185.08; 365/185.26
(58) Field of Classification Search
USPC ............. 365/185.24, 185.02, 185.03, 185.08, 365/185.26
See application file for complete search history.

(56) References Cited

U.S. PATENT DOCUMENTS

| | | | |
|---|---|---|---|
| 6,798,698 B2 * | 9/2004 | Tanaka et al. ............. | 365/185.22 |
| 7,058,540 B2 | 6/2006 | He et al. | |
| 7,200,162 B2 | 4/2007 | Kang et al. | |
| 8,032,810 B2 * | 10/2011 | Ishikawa et al. .............. | 714/754 |
| 8,077,515 B2 | 12/2011 | Shen et al. | |
| 8,199,579 B2 * | 6/2012 | Shiino et al. ............. | 365/185.17 |
| 8,446,777 B2 * | 5/2013 | Ueno et al. ................ | 365/185.24 |
| 8,576,622 B2 * | 11/2013 | Yoon et al. ................ | 365/185.03 |
| 2010/0070801 A1 | 3/2010 | Cornwell et al. | |
| 2010/0321995 A1 | 12/2010 | Sarin | |
| 2011/0038209 A1 | 2/2011 | Huang et al. | |
| 2011/0062314 A1 | 3/2011 | Doege | |
| 2011/0141136 A1 | 6/2011 | Cardno et al. | |
| 2011/0280084 A1 | 11/2011 | Radke et al. | |
| 2011/0289376 A1 | 11/2011 | Maccarrone et al. | |
| 2012/0182810 A1 | 7/2012 | Radke et al. | |
| 2012/0240011 A1 | 9/2012 | Helm et al. | |
| 2012/0262991 A1 | 10/2012 | Ghilardelli | |

FOREIGN PATENT DOCUMENTS

KR 10-20110100347 A 9/2011

OTHER PUBLICATIONS

U.S. Appl. No. 13/335,309, entitled, "Methods and Apparatuses for Determining Threshold Voltage Shift," filed Dec. 22, 2011, Zhenlei Shen, (27 pgs.).
U.S. Appl. No. 13/413,130, entitled, "Memory and Sense Parameter Determination Methods," filed Mar. 6, 2012, Zhenlei Shen, et al., (25 pgs.).
International Search Report and Written Opinion of related international application No. PCT/US2013/057351, dated Dec. 12, 2013, 15 pp.

* cited by examiner

*Primary Examiner* — Pho M Luu
(74) *Attorney, Agent, or Firm* — Brooks, Cameron & Huebsch, PLLC

(57) ABSTRACT

An apparatuses and methods for inferring threshold voltage distributions associated with memory cells via interpolation. A determining soft data for a group of memory cells each programmed to one of a number of data states, wherein the soft data comprises a number of different soft data values, determining a quantity of memory cells associated with each of the different soft data values, and inferring at least a portion of a threshold voltage distribution associated with the group of memory cells via an interpolation process using the determined quantities of memory cells associated with each of the different soft data values.

39 Claims, 5 Drawing Sheets

INFERRING THRESHOLD VOLTAGE DISTRIBUTIONS ASSOCIATED WITH MEMORY CELLS VIA INTERPOLATION

TECHNICAL FIELD

The present disclosure relates generally to semiconductor memory and methods, and more particularly, to inferring threshold voltage distributions associated with memory cells via interpolation.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its information and can include random-access memory (RAM), dynamic random access memory (DRAM), and synchronous dynamic random access memory (SDRAM), among others. Non-volatile memory can provide persistent information by retaining stored information when not powered and can include NAND flash memory, NOR flash memory, phase change random access memory (PCRAM), resistive random access memory (RRAM), and magnetic random access memory (MRAM), among others.

Memory devices can be combined together to form a solid state drive (SSD). An SSD can include non-volatile memory (e.g., NAND flash memory and/or NOR flash memory), and/or can include volatile memory (e.g., DRAM and/or SRAM), among various other types of non-volatile and volatile memory. Flash memory devices can include memory cells storing information in a charge storage structure such as a floating gate, for instance, and may be utilized as non-volatile memory for a wide range of electronic applications. Flash memory devices typically use a one-transistor memory cell that allows for high memory densities, high reliability, and low power consumption.

Memory cells in an array architecture can be programmed to a desired state. For instance, electric charge can be placed on or removed from the charge storage structure (e.g., floating gate) of a memory cell to program the cell to a particular data state. The stored charge on the charge storage structure of the memory cell can indicate a threshold voltage (Vt) of the cell.

For example, a single level cell (SLC) can be programmed to a targeted one of two different data states, which can be represented by the binary units 1 or 0. Some flash memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit).

DETAILED DESCRIPTION

Figure 1:
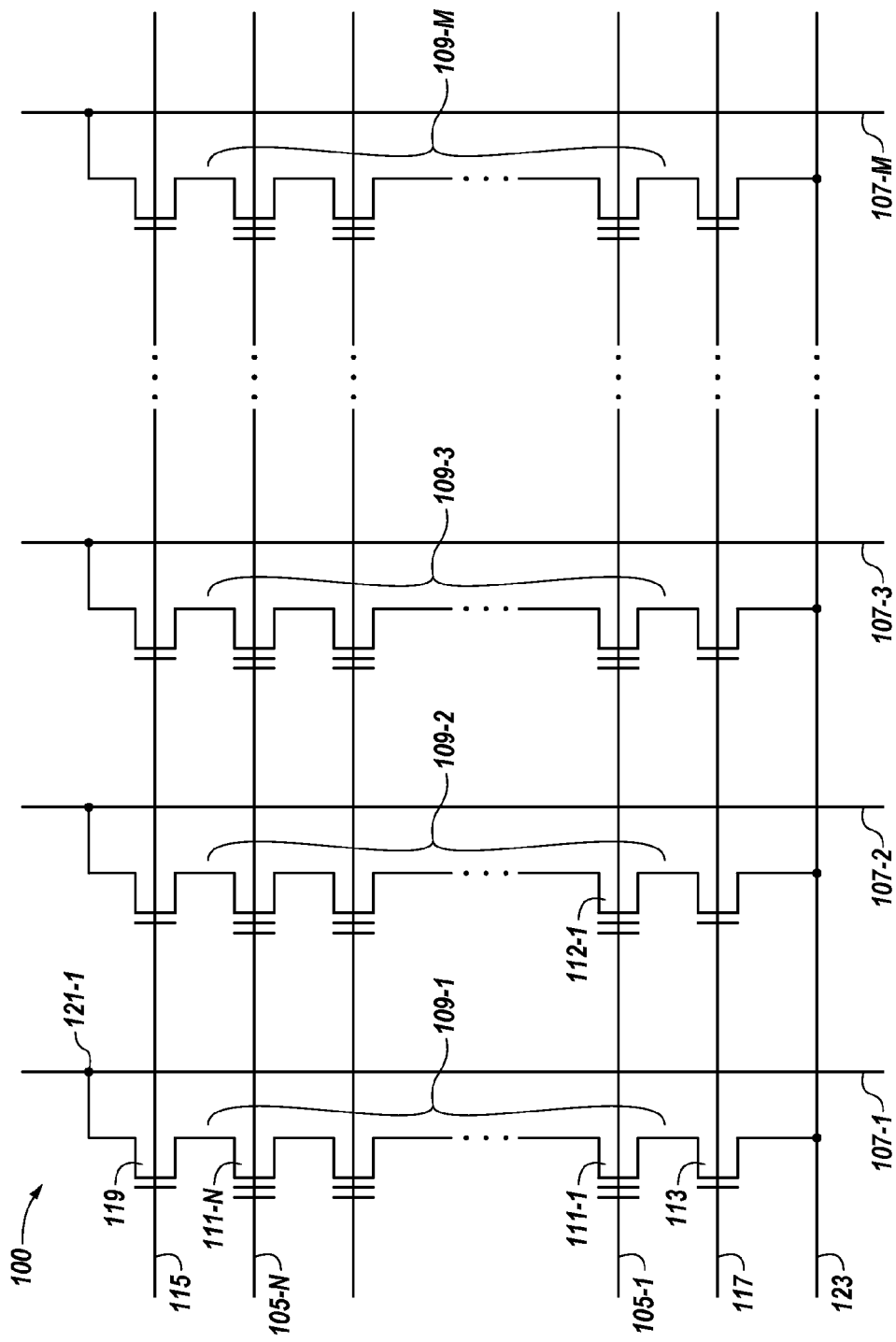
FIG. 1 illustrates a schematic diagram of a portion of a non-volatile memory array in accordance with a number of embodiments of the present disclosure.

The present disclosure includes apparatuses and methods for inferring threshold voltage distributions associated with memory cells via interpolation. A number of embodiments include determining soft data for a group of memory cells each programmed to one of a number of data states, wherein the soft data comprises a number of different soft data values, determining a quantity of memory cells associated with each of the different soft data values, and inferring at least a portion of a threshold voltage distribution associated with the group of memory cells via an interpolation process using the determined quantities of memory cells associated with each of the different soft data values.

Hard data can refer to a binary data value stored in one or more memory cells and provided to a host responsive to a read operation, for example. In various instances, soft data can also be determined in association with a read operation. For example, during a read operation, a ramped sensing signal can be applied to a selected memory cell, and a page buffer can latch a digital value corresponding to the amplitude of the sensing signal when the selected memory cell conducts (or stops conducting, in the case of a falling slope read operation). The most significant bit(s) of the digital value can correspond to the hard data (e.g., the data state of the selected cell), and the least significant bit(s) of the digital value can correspond to the associated soft data. Soft data can, for example, indicate the quality and/or confidence of the hard data (e.g., information regarding the probability of the cell storing the read hard data or of the cell storing different data). Accordingly, soft data can provide benefits such as increased accuracy and/or reliability (e.g., decreased error rate), and/or increased memory life, among other benefits.

For example, in a number of embodiments of the present disclosure, soft data associated with a number of memory cells can be used to infer a threshold voltage (Vt) distribution (e.g., a Vt distribution curve) associated with the number of memory cells via an interpolation process, as will be further described herein. Using interpolation to infer a Vt distribution can provide an increased Vt distribution resolution as compared to previous approaches (e.g., a 50 millivolt Vt distribution resolution as compared to a 200 millivolt Vt distribution resolution). Providing an increased (e.g., finer) Vt distribution resolution can provide benefits such as enabling further signal processing (e.g., valley detection), among other benefits.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory cells can refer to one or more memory cells. Additionally, the designators "M" and "N" as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 100 may reference element "00" in FIG. 1, and a similar element may be referenced as 300 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

FIG. 1 illustrates a schematic diagram of a portion of a non-volatile memory array 100 in accordance with a number of embodiments of the present disclosure. The embodiment of FIG. 1 illustrates a NAND architecture non-volatile memory array. However, embodiments described herein are not limited to this example. As shown in FIG. 1, memory array 100 includes access lines (e.g., word lines 105-1, ..., 105-N) and intersecting data lines (e.g., local bit lines) 107-1, 107-2, 107-3, ..., 107-M. For ease of addressing in the digital environment, the number of word lines 105-1, ..., 105-N and the number of local bit lines 107-1, 107-2, 107-3, ..., 107-M can be some power of two (e.g., 256 word lines by 4,096 bit lines).

Memory array 100 includes NAND strings 109-1, 109-2, 109-3, ..., 109-M. Each NAND string includes non-volatile memory cells 111-1, ..., 111-N, each communicatively coupled to a respective word line 105-1, ..., 105-N. Each NAND string (and its constituent memory cells) is also associated with a local bit line 107-1, 107-2, 107-3, ..., 107-M. The non-volatile memory cells 111-1, ..., 111-N of each NAND string 109-1, 109-2, 109-3, ..., 109-M are connected in series source to drain between a source select gate (SGS) (e.g., a field-effect transistor (FET)) 113, and a drain select gate (SGD) (e.g., FET) 119. Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to bit line 107-1 of the corresponding NAND string 109-1 at drain contact 121-1. The source of drain select gate 119 is connected to the drain of the last memory cell 111-N (e.g., a floating-gate transistor) of the corresponding NAND string 109-1.

In a number of embodiments, construction of non-volatile memory cells 111-1, ..., 111-N includes a source, a drain, a charge storage structure such as a floating gate, and a control gate. Non-volatile memory cells 111-1, ..., 111-N have their control gates coupled to a word line, 105-1, ..., 105-N respectively. A "column" of the non-volatile memory cells, 111-1, ..., 111-N, make up the NAND strings 109-1, 109-2, 109-3, ..., 109-M, and are coupled to a given local bit line 107-1, 107-2, 107-3, ..., 107-M, respectively. A "row" of the non-volatile memory cells are those memory cells commonly coupled to a given word line 105-1, ..., 105-N. The use of the terms "column" and "row" is not meant to imply a particular linear (e.g., vertical and/or horizontal) orientation of the non-volatile memory cells. A NOR array architecture would be similarly laid out, except that the string of memory cells would be coupled in parallel between the select gates.

As one of ordinary skill in the art will appreciate, subsets of cells coupled to a selected word line (e.g., 105-1, ..., 105-N) can be programmed and/or sensed (e.g., read) together as a page of memory cells. A programming operation (e.g., a write operation) can include applying a number of program pulses (e.g., 16V-20V) to a selected word line in order to increase the threshold voltage (Vt) of selected cells coupled to that selected access line to a desired program voltage level corresponding to a target (e.g., desired) data state.

A sense operation, such as a read or program verify operation, can include sensing a voltage and/or current change of a bit line coupled to a selected cell in order to determine the data state of the selected cell, as well as the soft data associated therewith. The sensing operation can involve providing a voltage to (e.g., biasing) a bit line (e.g., bit line 107-1) associated with a selected memory cell above a voltage (e.g., bias voltage) provided to a source line (e.g., source line 123) associated with the selected memory cell. A sensing operation could alternatively include precharging the bit line followed with discharge when a selected cell begins to conduct, and sensing the discharge.

Sensing the state of a selected cell can include providing a number of ramped sensing signals (e.g., read voltages) to a selected word line while providing a number of pass signals (e.g., read pass voltages) to the word lines coupled to the unselected cells of the string sufficient to place the unselected cells in a conducting state independent of the Vt of the unselected cells. The bit line corresponding to the selected cell being read and/or verified can be sensed to determine whether or not the selected cell conducts in response to the particular sensing voltage applied to the selected word line. For example, the data state and/or associated soft data of a selected cell can be determined by the word line voltage at which the bit line current reaches a particular reference current associated with a particular state.

As one of ordinary skill in the art will appreciate, in a sensing operation performed on a selected memory cell in a NAND string, the unselected memory cells of the string are biased so as to be in a conducting state. In such a sensing operation, the data state and/or associated soft data of the selected cell can be determined based on the current and/or voltage sensed on the bit line corresponding to the string. For instance, the data state and/or associated soft data of the selected cell can be determined based on whether the bit line current changes by a particular amount or reaches a particular level in a given time period.

When the selected cell is in a conductive state, current flows between the source line contact at one end of the string and a bit line contact at the other end of the string. As such, the current associated with sensing the selected cell is carried through each of the other cells in the string, the diffused regions between cell stacks, and the select transistors.

Figure 2:
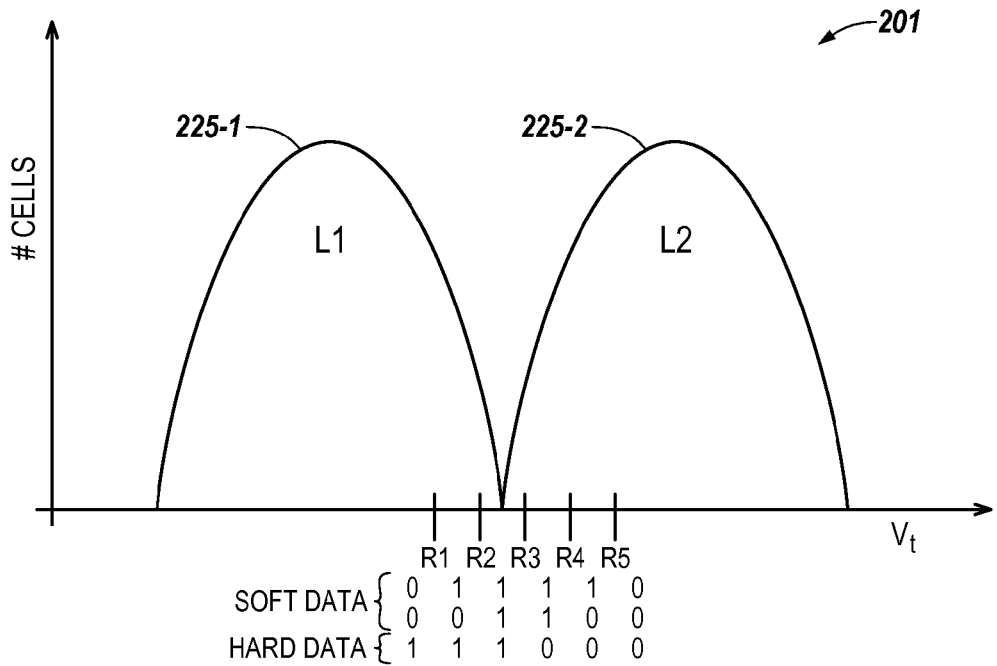
FIG. 2 illustrates a diagram of a number of threshold voltage distributions, sensing voltages, and data assignments in accordance with a number of embodiments of the present disclosure.

FIG. 2 illustrates a diagram 201 of a number of threshold voltage (Vt) distributions, sensing voltages, and data (e.g., hard and soft data) assignments in accordance with a number of embodiments of the present disclosure. The example shown in FIG. 2 can represent, for example, memory cells 111-1, ..., 111-N previously described in connection with FIG. 1. For instance, the example shown in FIG. 2 can represent a first (e.g., lower) page of two-bit (e.g., four-state) memory cells. As will be appreciated by one of ordinary skill in the art, an analogous representation of the second (e.g., upper) page of the two-bit memory cells (not shown in FIG. 2 for simplicity) can include the Vt distributions, sensing voltages, and data assignments of the first page, as well as Vt distributions, sensing voltages, and data assignments that mirror those of the first page. However, embodiments of the present disclosure are not limited to this example of two-bit memory cells, as will be appreciated by one of ordinary skill in the art.

As shown in FIG. 2, Vt distributions 225-1 and 225-2 represent two target data states (e.g., L1 and L2, respectively) to which the memory cells can be programmed. Target state L1 can correspond to data 1, and target state L2 can correspond to data 0. That is, the data state of each of the memory cells can correspond to one of a number of (e.g., two) data values (e.g., hard data). For example, in the embodiment illustrated in FIG. 2, the first data state (e.g., L2) to which the memory cells can be programmed corresponds to data 0 (e.g., a hard data value of 0 can be output responsive to a read request), and the second data state (e.g., L1) to which the memory cells can be programmed corresponds to data 1 (e.g., a hard data value of 1 can be output responsive to a read request). Embodiments of the present disclosure, however, are not limited to these particular data assignments.

Vt distributions 225-1 and 225-2 can represent a number of memory cells that are programmed to the corresponding target states, with the height of a Vt distribution curve indicating a number of cells programmed to a particular voltage within the Vt distribution (e.g., on average). The width of the Vt distribution curve indicates the range of voltages that represent a particular target state (e.g., the width of the Vt distribution curve 225-2 for L2 represents the range of voltages that correspond to hard data 0).

During a sense (e.g., read) operation, a sensing (e.g., read) voltage located between Vt distributions 225-1 and 225-2 can be used to distinguish between states L1 and L2. In a read operation performed on a selected memory cell in a NAND string, the unselected memory cells of the string can be biased with a pass voltage so as to be in a conducting state. When all cells in a string are in a conductive state, current can flow between the source line contact at one end of the string and a drain line contact at the other end of the string. As such, the data state of the selected cell can be determined based on the current and/or voltage sensed on a bit line corresponding to a particular string when the selected cell begins to conduct (e.g., in response to the particular read voltage applied to the control gate of the cell (via a selected word line)). For example, the data state of the selected cell can be determined based on whether the bit line current changes by a particular amount, or reaches a particular level within a given time period. Other types of read operations are also possible, as will be understood by one of ordinary skill in the art.

Each data state (e.g., L1, and L2) of the memory cells can have soft data associated therewith. For instance, the Vt distribution (e.g., 225-1 or 225-2) associated with each data state can have soft data (e.g., bits) assigned thereto. As previously described herein, the soft data can correspond to the least significant bit(s) of a digital value that corresponds to the amplitude of a ramped sensing signal applied to a selected memory cell when the cell conducts (or stops conducting, in the case of a falling slope read operation). In the example illustrated in FIG. 2, two bits are used to provide soft data (e.g., quality and/or confidence information) associated with the data states.

Soft data associated with a data state of a memory cell can indicate a location of the Vt associated with the memory cell within the Vt distribution associated with the data state of the memory cell. For example, in the embodiment illustrated in FIG. 2, soft data 00 associated with data state L2 indicates that the Vt of the memory cell is located at a voltage greater than read voltage R5 within Vt distribution 225-2 (e.g., that the Vt of the memory cell is located toward the middle of Vt distribution 225-2), and soft data 00 associated with data state L1 indicates that the Vt of the memory cell is located at a voltage less than read voltage R1 within Vt distribution 225-1 (e.g., that the Vt of the memory cell is located toward the middle of Vt distribution 225-1). Additionally, soft data 10 associated with data state L2 indicates that the Vt of the memory cell is located at a voltage between read voltages R4 and R5 within Vt distribution 225-2, and soft data 10 associated with data state L1 indicates that the Vt of the memory cell is located at a voltage between read voltages R1 and R2 (e.g., soft data 10 indicates that the Vt of the memory cell is located closer toward the edge of the Vt distribution than soft data 00). Further, soft data 11 associated with data state L2 (e.g., hard data 0) indicates that the Vt of the memory cell is located at a voltage between read voltages R3 and R4. Additionally, soft data 11 associated with data state L1 (e.g., hard data 1) indicates that the Vt of the memory cell is located at a voltage between read voltages R2 and R3 (e.g., that the hard data may not match the target state to which the cell was originally programmed).

Soft data associated with a data state of a memory cell can also indicate a probability of whether the Vt associated with the memory cell corresponds to the data state of the memory cell. For example, in the embodiment illustrated in FIG. 2, soft data 00 associated with the data state L2 indicates a strong probability that the Vt of the memory cell corresponds to data state L2, soft data 10 associated with the data state L2 indicates a moderate probability (e.g., a probability that is less than the strong probability) that the Vt of the memory cell corresponds to data state L2, and soft data 11 associated with data state L2 indicates a weak probability (e.g., a probability that is less than the moderate probability) that the Vt of the memory cell corresponds to data state L2. Additionally, soft data 00 associated with the data state L1 indicates a strong probability that the Vt of the memory cell corresponds to data state L1, soft data 10 associated with data state L1 indicates a moderate probability that the Vt of the memory cell corresponds to data state L1, and soft data 11 associated with data state L1 indicates a weak probability that the Vt of the memory cell corresponds to data state L1.

Embodiments of the present disclosure are not limited to the read voltages and/or soft data assignments shown in FIG. 2. For example, a greater number of read voltages and/or soft data assignments can be used to indicate a more precise Vt location within a Vt distribution and/or a more precise probability of whether a Vt corresponds to a data state. However, for simplicity and so as not to obscure embodiments of the present disclosure, five read voltages and six soft data values (e.g., six different soft data possibilities) representing six different hard data quality and/or confidence levels have been illustrated in FIG. 2. Additionally, although the read voltages are shown in FIG. 2 as being spaced apart by the same voltage amount, embodiments of the present disclosure are not so limited (e.g., the read voltages can be spaced apart by different voltage amounts), as will be further described herein.

The soft data associated with the data state of a memory cell can be determined, for example, by performing a number of sense (e.g., read) operations on the memory cell using a number of read voltages (e.g., R1 through R5), as will be further described herein (e.g., in connection with FIGS. 4A-5C). The soft data can be used to infer the Vt distribution (e.g., the Vt distribution curve) associated with the memory cell, as will be further described herein (e.g., in connection with FIGS. 4A-5C). In a number of embodiments, the read operation(s) can also determine the data state of the memory cell. For instance, the data state of the memory cell and the soft data associated with the data state of the memory cell can both be determined by the same read operation.

Figure 3:
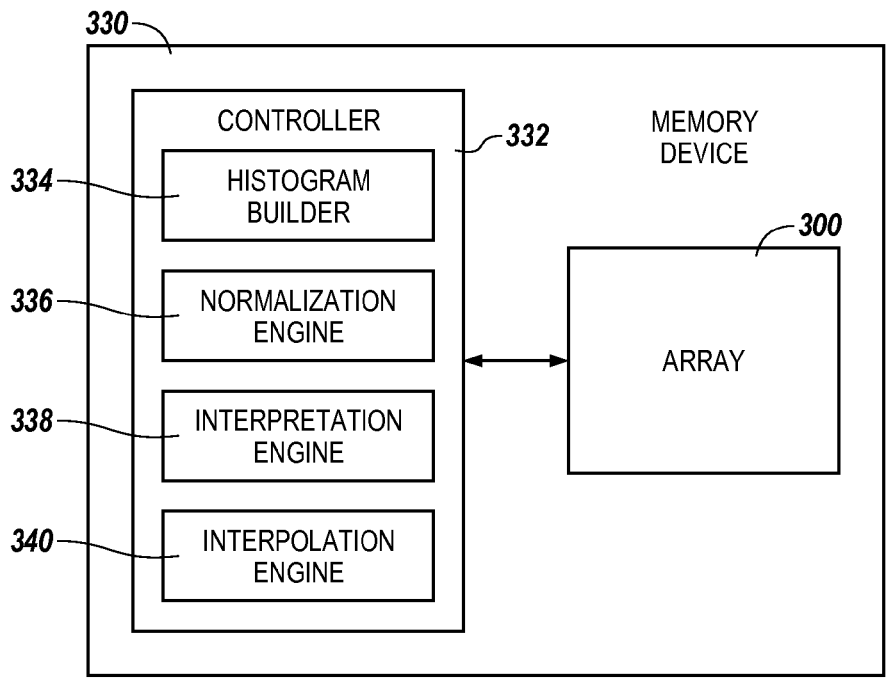
FIG. 3 illustrates a block diagram of an apparatus in the form of a memory device in accordance with a number of embodiments of the present disclosure.

FIG. 3 illustrates a block diagram of an apparatus in the form of a memory device 330 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example.

As shown in FIG. 3, memory device 330 includes a controller 332 coupled to a memory array 300. Memory array 300 can be, for example, memory array 100 previously described in connection with FIG. 1. Although one memory array is shown in FIG. 3, embodiments of the present disclosure are not so limited (e.g., memory device 330 can include more than one memory array coupled to controller 332).

Controller 332 can include, for example, control circuitry and/or firmware. Controller 332 can be included on the same physical device (e.g., the same die) as memory array 300, or can be included on a separate physical device that is communicatively coupled to the physical device that includes memory array 300. In a number of embodiments, components of controller 332 can be spread across multiple physical devices (e.g., some components on the same die as the array, and some components on a different die, module, or board).

In the embodiment illustrated in FIG. 3, controller 332 includes a histogram builder 334, a normalization engine 336, an interpretation engine 338, and an interpolation engine 340. The functionality of controller 332 will be further described herein (e.g., in connection with FIGS. 4A-5C). For example, controller 332 can use soft data associated with the memory cells of memory array 300 to infer the Vt distribution (e.g., the Vt distribution curve) associated with the memory cells via an interpolation process, as will be further described herein.

The embodiment illustrated in FIG. 3 can include additional circuitry that is not illustrated so as not to obscure embodiments of the present disclosure. For example, memory device 330 can include address circuitry to latch address signals provided over I/O connectors through I/O circuitry. Address signals can be received and decoded by a row decoder and a column decoder, to access memory array 300. As an additional example, memory device 330 can include sense (e.g., read) circuitry.

Figure 4A:
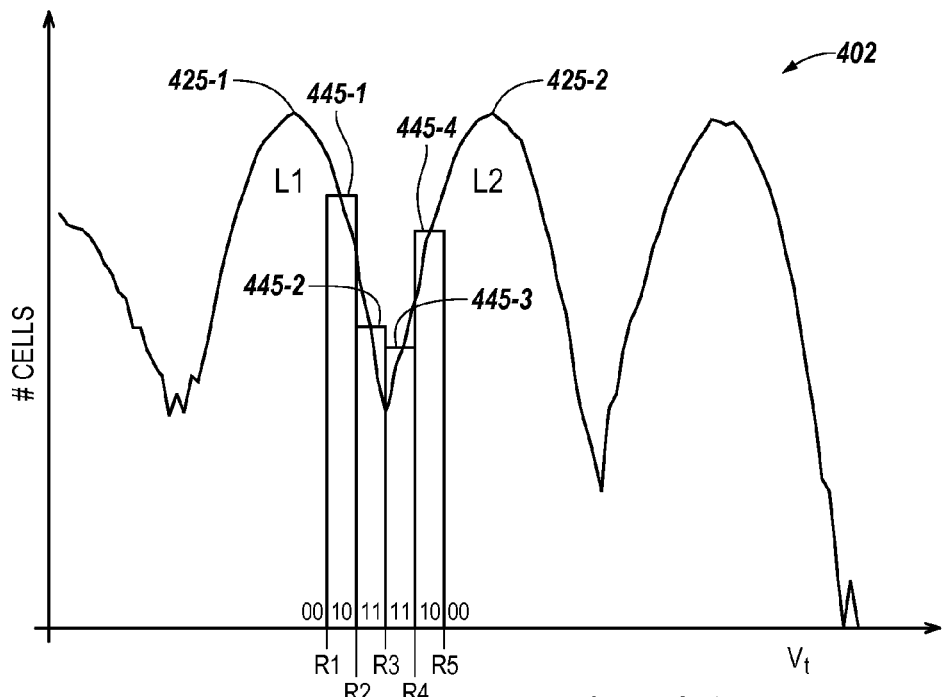
FIGS. 4A-4B illustrate a diagram of a number of threshold voltage distributions, sensing voltages, data assignments, and histograms in accordance with a number of embodiments of the present disclosure.
Figure 5A:
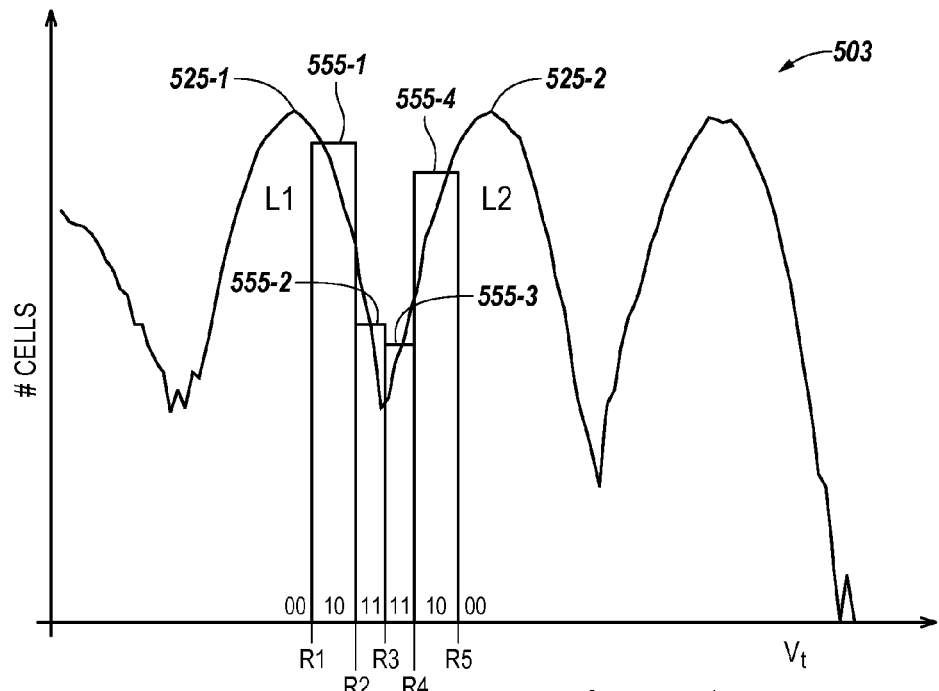
FIGS. 5A-5C illustrate a diagram of a number of threshold voltage distributions, sensing voltages, data assignments, and histograms in accordance with a number of embodiments of the present disclosure.
Figure 5B:
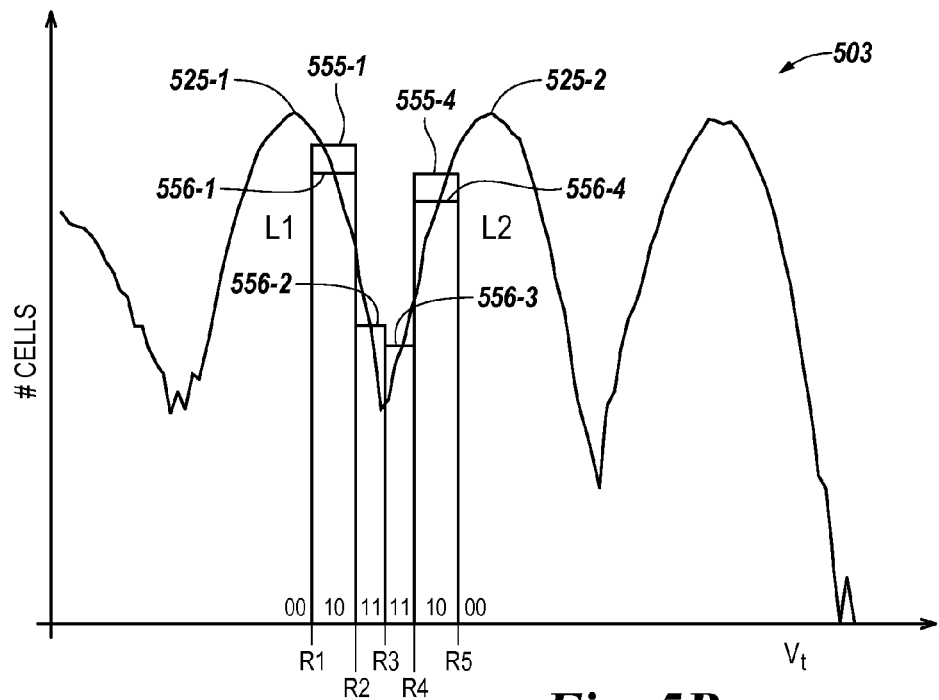

FIGS. 4A and 5A illustrate diagrams 402 and 503, respectively, of a number of threshold voltage (Vt) distributions, sensing voltages, data (e.g., soft data) assignments, and histograms in accordance with a number of embodiments of the present disclosure. Vt distributions 425-1, 425-2, 525-1, and 525-2 illustrated in FIGS. 4A and 5A, respectively, can be the actual (e.g., true) Vt distributions associated with the memory cells of memory arrays 100 and/or 300, and can be analogous to Vt distributions 225-1 and 225-2, respectively, previously described in connection with FIG. 2.

In a number of embodiments, controller 332 can determine (e.g., sense) soft data for a group of the memory cells (e.g., soft data associated with the data states of the group of memory cells). Each memory cell of the group can be programmed to one of a number of data states (e.g., L1 or L2), as previously described herein. The soft data for each memory cell of the group can be one of a number of different soft data values (e.g., soft data possibilities), and can be analogous to the soft data previously described in connection with FIG. 2. For instance, as illustrated in FIGS. 4A and 5A, the different soft data values can include soft data 10 associated with data state L1, soft data 11 associated with data state L1, soft data 11 associated with data state L2, and soft data 10 associated with associated with data state L2, in a manner analogous to that previously described in connection with FIG. 2. That is, the number of different soft data values can be four. However, embodiments are not limited to a particular number of soft data values or soft data assignments. For example, in some embodiments, the different soft data values can also include soft data 00 associated with data state L1 and soft data 00 associated with data state L2, as illustrated in FIGS. 4A and 5A.

Controller 332 can determine the soft data for the group of memory cells by performing a number of sense (e.g., read) operations on the memory cells using a number of sensing voltages. For example, controller 332 can perform a number of separate (e.g., repeated) sense operations each using a different sensing voltage, or controller 332 can perform one (e.g., a single) sense operation using a ramped sensing signal.

The sensing voltages can be, for example, read voltages R1, R2, R3, R4, and R5 illustrated in FIGS. 4A and 5A. That is, the number of sensing voltages can be five, and can be located around (e.g., near) the minimum (e.g., valley) of Vt distributions curves 425-1 and 425-2. However, embodiments are not limited to a particular number or location of sensing voltages used to determine the soft data. For example, in a number of embodiments, the sensing voltages can be located in arbitrary positions along the Vt axis.

In a number of embodiments, the sensing voltages can be spaced apart by the same voltage amount, as shown in the example illustrated in FIG. 4A. For example, the sensing voltages can be spaced apart by 200 millivolts (mV). However, embodiments are not limited to a particular voltage spacing amount.

In a number of embodiments, the sensing voltages can be spaced apart by different voltage amounts, as shown in the example illustrated in FIG. 5A. For instance, in the example illustrated in FIG. 5A, read voltages R1 and R2 and read voltages R4 and R5 are spaced apart by a first voltage amount (e.g., 300 mV), and read voltages R2 and R3 and read voltages R3 and R4 are spaced apart by a second voltage amount (e.g., 200 mV) that is different than the first voltage amount. However, embodiments are not limited to a particular different voltage amounts or a particular number of different voltage amounts. For example, in a number of embodiments, each of the sensing voltages can be spaced apart by different voltage amounts.

Controller 332 (e.g., histogram builder 334) can then determine (e.g., count) the quantity (e.g., amount) of memory cells associated with each of the different soft data values. For example, histogram builder 334 can create (e.g., build) a histogram for each of the different soft data values. For instance, in the examples illustrated in FIGS. 4A and 5A, histograms 445-1 and 555-1, respectively, correspond to soft data 10 associated with data state L1, histograms 445-2 and 555-2, respectively, correspond to soft data 11 associated with data state histograms 445-3 and 555-3, respectively, correspond to soft data 11 associated with data state L2, and histograms 445-4 and 555-4, respectively, correspond to soft data 10 associated with data state L2.

The height of each histogram (e.g., the quantity of memory cells within each histogram) can correspond to the quantity of memory cells associated with the soft data value for that particular histogram. For instance, in the examples illustrated in FIGS. 4A and 5A, the height of histograms 445-1 and 555-1, respectively, correspond to the quantity of memory cells associated with soft data 10 associated with data state L1, the height of histograms 445-2 and 555-2, respectively, correspond to the quantity of memory cells associated with soft data 11 associated with data state L1, the height of histograms 445-3 and 555-3, respectively, correspond to the quantity of memory cells associated with soft data 11 associated with data state L2, and the height of histograms 445-4 and 555-4, respectively, correspond to the quantity of memory cells associated with soft data 10 associated with data state L2.

The width of each histogram can correspond to the spacing between the sensing voltages used to determine the soft data for the group of memory cells. For instance, in the example illustrated in FIG. 4A, the widths of histograms 445-1, 445-2, 445-3, and 445-4 are the same (e.g., 200 mV). In the example illustrated in FIG. 5A, the widths of histograms 555-1 and 555-4 are the same (e.g., 300 mV), and the widths of histograms 555-2 and 555-3 are the same (e.g., 200 mV). Further, because the widths of histograms 555-1 and 555-4 are greater than the widths of histograms 445-1 and 445-4 (e.g., because the spacing between read voltages R1 and R2 and read voltages R4 and R5 is greater in the example illustrated in FIG. 5 than in the example illustrated in FIG. 4), the heights of histograms 555-1 and 555-4 are greater than the heights of histograms 445-1 and 445-4, respectively (e.g., more memory cells are associated with soft data 10 in the example illustrated in FIG. 5 than in the example illustrated in FIG. 4).

In embodiments in which the sensing voltages used to determine the soft data are spaced apart by the same voltage amount (e.g., the example illustrated in FIG. 4A), controller 332 (e.g., interpretation engine 338) can assign a Vt value (e.g., single Vt values) to represent each of the spacings between the sensing voltages (e.g., each Vt interval along the x-axis of diagram 402). For instance, a first Vt value can be used to represent the spacing between read voltages R1 and R2, a second value can be used to represent the spacing between read voltages R2 and R3, a third value can be used to represent the spacing between read voltages R3 and R4, etc. That is, interpretation engine 338 can refine the x-axis (e.g., the Vt) of diagram 402.

Interpretation engine 338 can assign the Vt values by, for example, mapping the spacings between the sensing voltages. The mapping can be, for example, a base mapping (e.g., the assigned Vt value for a spacing can correspond to the midpoint of the spacing), or a heuristic mapping (e.g., the assigned Vt value for a spacing can correspond to a weighted average of the spacing). Interpretation engine 338 may use the base mapping if, for example, it is expected that the quantity of memory cells within the histograms are distributed evenly within the histograms, and interpretation engine 338 may use the heuristic mapping if, for example, it is expected that the quantity of memory cells within the histograms are distributed unevenly within the histograms. The expectation of the distribution of the quantity of memory cells within the histograms can be based on, for example, a previously determined Vt distribution associated with the group of memory cells.

Controller 332 (e.g., interpolation engine 340) can then infer (e.g., approximate) at least a portion of a Vt distribution (e.g., at least a portion of a Vt distribution curve) associated with the group of memory cells via an interpolation process using the determined quantities of memory cells associated with each of the different soft data values and the Vt values assigned to represent each of the spacings between the sensing voltages. The interpolation process can include, for example, fitting the quantities of memory cells and the assigned Vt values to a curve. The fitted curve can form at least the portion of the Vt distribution (e.g., the Vt distribution curve).

Figure 4B:
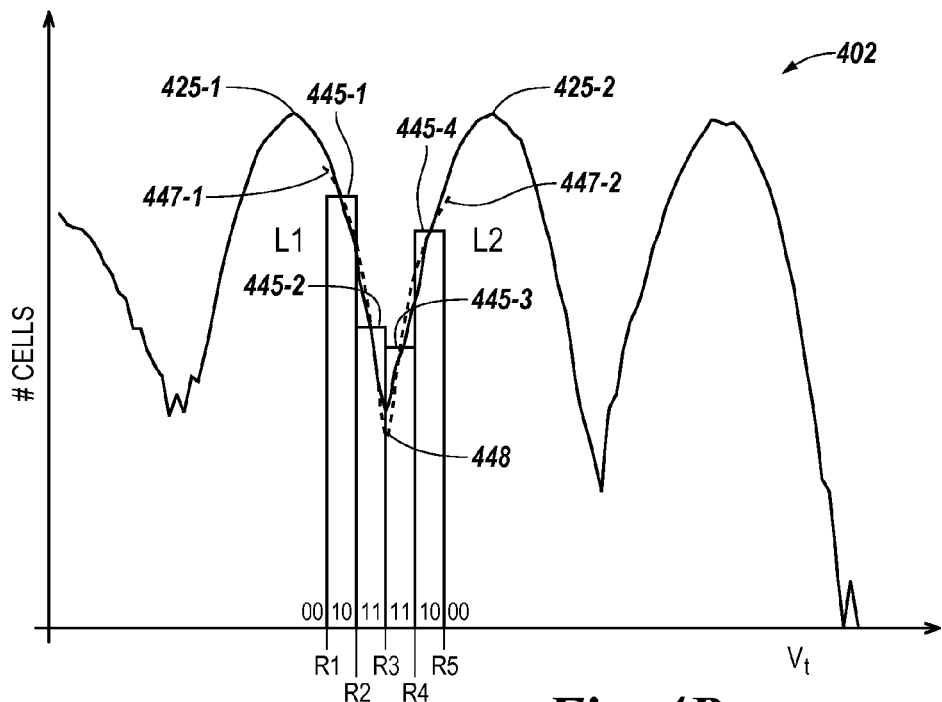

An example of a portion of the inferred Vt distribution is illustrated in FIG. 4B. In the example illustrated in FIG. 4B, the inferred Vt distribution includes Vt distributions (e.g., Vt distribution curves) 447-1 and 447-2 that correspond to data states L1 and L2, respectively. As shown in FIG. 4B, the inferred Vt distributions 447-1 and 447-2 may closely approximate the actual Vt distributions 425-1 and 425-2, respectively, but may not exactly match the actual Vt distributions.

In the example illustrated in FIG. 4B, the interpolation process is a cubic spline interpolation process. However, embodiments of the present disclosure are not limited to a particular type of interpolation process. For example, the interpolation process could be a linear interpolation process or a polynomial interpolation process. The type of interpolation process can depend on, for example, the number of determined quantities of memory cells (e.g., the number of different soft data values and/or the number of histograms created by histogram builder 334). Additionally, the closeness of the approximation of the inferred Vt distribution to the actual Vt distribution can depend on the type of interpolation process. For instance, a polynomial interpolation process may provide a closer approximation to the actual Vt distribution than a linear interpolation process, and a cubic spline interpolation process may provide a closer approximation to the actual Vt distribution than a polynomial interpolation process.

Controller 332 can then determine, based on the inferred Vt distribution (e.g., the inferred Vt distribution curve), a sensing (e.g., read) voltage used to determine a data state (e.g., the hard data) of the group of memory cells. For example, the sensing voltage used to determine a data state of the group of memory cells can correspond to the minimum (e.g., the valley) of the inferred Vt distribution curve. For instance, in the example illustrated in FIG. 4B, the sensing voltage would be the voltage along the Vt axis that corresponds to the minimum point 448 of the inferred Vt distribution curves 447-1 and 447-2. That is, in the example illustrated in FIG. 4B, the sensing voltage would be read voltage R3.

In a number of embodiments, controller 332 can determine the width of the inferred Vt distribution. That is, controller 332 can determine the range of voltages that represent the target state(s) represented by the inferred Vt distribution.

In embodiments in which the sensing voltages used to determine the soft data for the group of memory cells are spaced apart by different voltage amounts (e.g., the example illustrated in FIG. 5A), controller 332 (e.g., normalization engine 336) can normalize the determined quantities of memory cells associated with each of the different soft data values. Normalizing the determined quantities of memory cells associated with each of the different soft data values can include, for example, equalizing the weight (e.g., the statistical weight) of the determined quantities of memory cells associated with each of the different soft data values. For instance, in the example illustrated in FIG. 5A, the normalization can include adjusting (e.g., transforming) the quantity of memory cells associated with soft data value 10 (e.g., the quantity of memory cells within the wider histograms 555-1 and 555-4) to the same scale and/or level as the quantity of memory cells associated with soft data value 00 (e.g., the quantity of memory cells within the narrower histograms 555-2 and 555-3) in order to compensate for the different sensing voltage spacings. That is, normalization engine 336 can refine the y-axis (e.g., the histogram heights) of diagram 503.

For example, normalization engine 336 can normalize the determined quantities of memory cells associated with each of the different soft data values by adjusting the heights of a number of the histograms created by histogram builder 334 such that the weight of the quantities of memory cells associated with each of the different soft data values is equal. For instance, in the example illustrated in FIG. 5B, the heights of histograms 555-1 and 555-4 are decreased to form normalized histograms 556-1 and 556-4, respectively, while the heights of histograms 555-2 and 555-3 remain the same, forming normalized histograms 556-2 and 556-3, respectively.

The height of each histogram after the heights of the number of the histograms are adjusted (e.g., the height of each normalized histogram) can correspond to the normalized quantities of memory cells associated with each of the different soft data values. For instance, in the example illustrated in FIG. 5B, the height of normalized histogram 556-1 corresponds to the normalized quantity of memory cells associated with soft data 10 associated with data state L1, the height of normalized histogram 556-2 corresponds to the normalized quantity of memory cells associated with soft data 11 associated with data state L1, the height of normalized histogram 556-3 corresponds to the normalized quantity of memory cells associated with soft data 11 associated with data state L2, and the height of normalized histogram 556-4 corresponds to the normalized quantity of memory cells associated with soft data 10 associated with data state L2.

Controller 332 (e.g., interpretation engine 338) can then assign a Vt value (e.g., single Vt values) to represent each of the spacings between the sensing voltages (e.g., each Vt interval along the x-axis of diagram 503). For instance, in the example illustrated in FIG. 5B, a first Vt value can be used to represent the spacing between read voltages R1 and R2, a second value can be used to represent the spacing between read voltages R2 and R3, etc. Interpretation engine 338 can assign the Vt values by, for example, mapping the spacings between the sensing voltages in a manner analogous to that previously described herein.

Controller 332 (e.g., interpolation engine 340) can then infer (e.g., approximate) at least a portion of a Vt distribution (e.g., at least a portion of a Vt distribution curve) associated with the group of memory cells by performing an interpolation process using the normalized quantities of memory cells associated with each of the different soft data values and the Vt values assigned to represent each of the spacings between the sensing voltages. The interpolation can include, for example, fitting the normalized quantities of memory cells and the assigned Vt values to a curve. The fitted curve can form at least the portion of the inferred Vt distribution (e.g., the inferred Vt distribution curve).

Figure 5C:
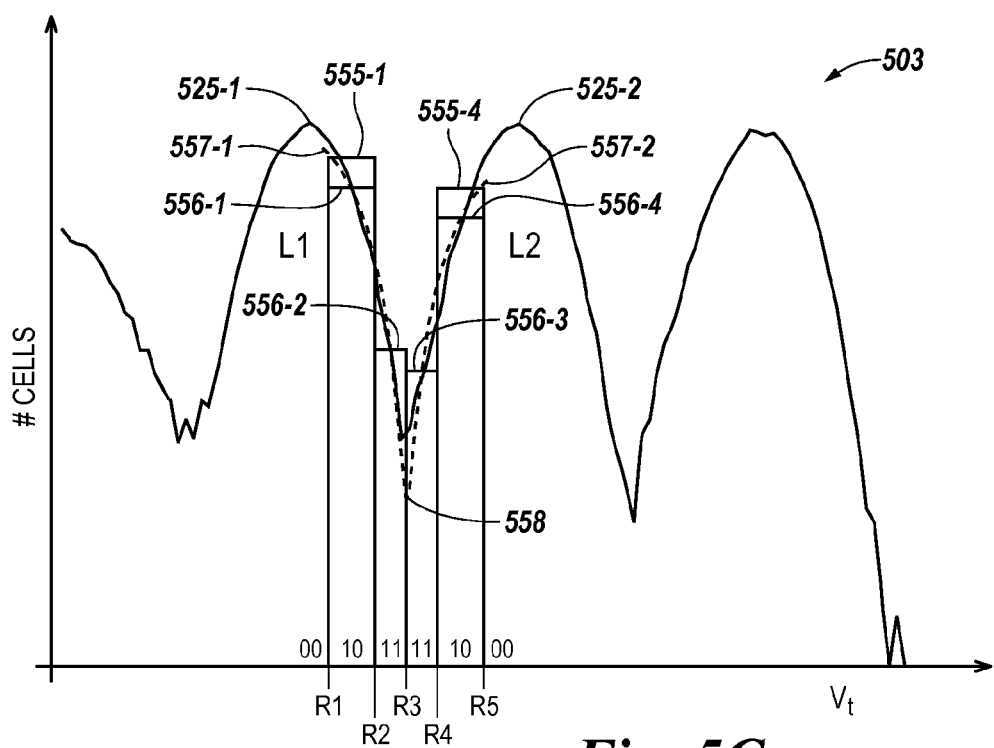

An example of a portion of the inferred Vt distribution is illustrated in FIG. 5C. In the example illustrated in FIG. 5C, the inferred Vt distribution includes Vt distributions (e.g., Vt distribution curves) 557-1 and 557-2 that correspond to data states L1 and L2, respectively. As shown in FIG. 5C, the inferred Vt distributions 557-1 and 557-2 may closely approximate the actual Vt distributions 525-1 and 525-2, respectively, but may not exactly match the actual Vt distributions.

In the example illustrated in FIG. 5C, the interpolation process is a cubic spline interpolation process. However, embodiments of the present disclosure are not limited to a particular type of interpolation process (e.g., the interpolation process can be a linear or a polynomial interpolation process), as previously described herein.

Controller 332 can then determine, based on the inferred Vt distribution, a sensing (e.g., read) voltage used to determine a data state (e.g., the hard data) of the group of memory cells. For example, the sensing voltage used to determine a data state of the group of memory cells can correspond to the minimum (e.g., the valley) of the inferred Vt distribution curve. For instance, in the example illustrated in FIG. 5C, the sensing voltage would be the voltage along the Vt axis that corresponds to the minimum point 558 of the inferred Vt distribution curves 557-1 and 557-2. That is, in the example illustrated in FIG. 5C, the sensing voltage would be read voltage R3. In a number of embodiments, controller 332 can determine the width of the inferred Vt distribution, as previously described herein.

Using interpolation to infer Vt distributions as described herein can provide an increased Vt distribution resolution. The increased Vt resolution can, for example, increase the ability to accurately define maxima (e.g., peaks) and/or minima (e.g., valleys) associated with the Vt distributions.

CONCLUSION

The present disclosure includes apparatuses and methods for inferring threshold voltage distributions associated with memory cells via interpolation. A number of embodiments include determining soft data for a group of memory cells each programmed to one of a number of data states, wherein the soft data comprises a number of different soft data values, determining a quantity of memory cells associated with each of the different soft data values, and inferring at least a portion of a threshold voltage distribution associated with the group of memory cells via an interpolation process using the determined quantities of memory cells associated with each of the different soft data values.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating memory, comprising:
   determining soft data for a group of memory cells each programmed to one of a number of data states, wherein the soft data comprises a number of different soft data values;
   determining a quantity of memory cells associated with each of the different soft data values; and
   inferring at least a portion of a threshold voltage distribution associated with the group of memory cells via an interpolation process using the determined quantities of memory cells associated with each of the different soft data values.

2. The method of claim 1, wherein the method includes:
   normalizing the determined quantities of memory cells associated with each of the different soft data values; and
   inferring at least the portion of the threshold voltage distribution associated with the group of memory cells via the interpolation process using the normalized quantities of memory cells associated with each of the different soft data values.

3. The method of claim 1, wherein the method includes determining a sensing voltage used to determine a data state of the group of memory cells based on the inferred portion of the threshold voltage distribution associated with the group of memory cells.

4. The method of claim 1, wherein determining the soft data for the group of memory cells includes performing a number of sense operations on the group of memory cells using a number of sensing voltages, wherein each of the number of sensing voltages are spaced apart by a same voltage amount.

5. The method of claim 1, wherein determining the quantity of memory cells associated with each of the different soft data values includes creating a histogram for each of the different soft data values, wherein a height of each histogram corresponds to the quantity of memory cells associated with the soft data value for that particular histogram.

6. The method of claim 5, wherein a width of each histogram corresponds to a spacing between sensing voltages used to determine the soft data for the group memory cells.

7. The method of claim 1, wherein the method includes:
   determining the soft data associated with the group of memory cells using a number of sensing voltages, wherein each of the sensing voltages are spaced apart by a voltage amount;
   assigning a threshold voltage value to represent each of the spacings between the sensing voltages; and
   inferring at least the portion of the threshold voltage distribution associated with the group of memory cells via the interpolation process using the threshold voltage values assigned to represent each of the spacings between the sensing voltages.

8. The method of claim 7, wherein assigning a threshold voltage value to represent each of the spacings between the sensing voltages includes mapping the spacings between the sensing voltages.

9. The method of claim 8, wherein the mapping of the spacings between the sensing voltages includes a base mapping of the spacings between the sensing voltages.

10. The method of claim 8, wherein the mapping of the spacings between the sensing voltages includes a heuristic mapping of the spacings between the sensing voltages.

11. The method of claim 8, wherein the mapping of the spacings between the sensing voltages is based on a previously determined threshold voltage distribution associated with the group of memory cells.

12. The method of claim 7, wherein the interpolation process using the threshold voltage values assigned to represent each of the spacings between the sensing voltages includes fitting the assigned threshold voltage values to a curve.

13. The method of claim 1, wherein the method includes:
    using a controller to determine the soft data for the group of memory cells;
    using a controller to determine the quantity of memory cells associated with each of the different soft data values; and
    using a controller to infer the at least a portion of the threshold voltage distribution associated with the group of memory cells via the interpolation process.

14. A method for operating memory, comprising:
    determining, using a number of sensing voltages spaced apart by a voltage amount, soft data for a group of memory cells each programmed to one of a number of data states, wherein the soft data comprises a number of different soft data values;
    determining the quantity of memory cells associated with each of the different soft data values;
    normalizing the determined quantities of memory cells associated with each of the different soft data values;
    assigning a threshold voltage value to represent each of the spacings between the sensing voltages; and
    inferring at least a portion of a threshold voltage distribution associated with the group of memory cells via an interpolation process using the threshold voltage values assigned to represent each of the spacings between the sensing voltages and the normalized quantities of memory cells associated with each of the different soft data values.

15. The method of claim 14, wherein a number of the number of sensing voltages are spaced apart by different voltage amounts.

16. The method of claim 14, wherein normalizing the determined quantities of memory cells associated with each of the different soft data values includes equalizing a weight of the determined quantities of memory cells associated with each of the different soft data values.

17. The method of claim 14, wherein the number of different soft data values is four.

18. The method of claim 14, wherein inferring at least the portion of the threshold voltage distribution associated with the group of memory cells includes inferring a threshold voltage distribution curve associated with the group of memory cells.

19. The method of claim 14, wherein the method includes determining a width of the portion of the threshold voltage distribution associated with the group of memory cells.

20. The method of claim 14, wherein the method includes:
    using a histogram builder to determine the quantity of memory cells associated with each of the different soft data values;
    using a normalization engine to normalize the determined quantities of memory cells associated with each of the different soft data values;
    using an interpretation engine to assign the threshold voltage values to represent the spacings between the sensing voltages; and
    using an interpolation engine to infer the at least a portion of the threshold voltage distribution associated with the group of memory cells via the interpolation process.

21. An apparatus, comprising:
    an array of memory cells; and
    a controller coupled to the array and configured to:

determine soft data for a group of the memory cells each programmed to one of a number of data states, wherein the soft data comprises a number of different soft data values;

determine a quantity of memory cells associated with each of the different soft data values; and perform an interpolation process using the determined quantities of memory cells associated with each of the different soft data values to infer at least a portion of a threshold voltage distribution curve associated with the group of memory cells.

22. The apparatus of claim 21, wherein the controller is configured to determine the soft data for the group of the memory cells using a number of sensing voltages, wherein each of the number of sensing voltages are spaced apart by a same voltage amount.

23. The apparatus of claim 21, wherein the controller is configured to determine a sensing voltage used to determine a data state of the group of the memory cells based on the inferred threshold voltage distribution curve associated with the group of memory cells.

24. The apparatus of claim 23, wherein the sensing voltage used to determine a data state of the group of the memory cells corresponds to a minimum of the inferred threshold voltage distribution curve.

25. An apparatus, comprising:
an array of memory cells;
a controller coupled to the array and configured to:
determine soft data for a group of the memory cells each programmed to one of a number of data states, wherein the soft data comprises a number of different soft data values; and
determine a quantity of memory cells associated with each of the different soft data values; and
an interpolation engine configured to infer at least a portion of a threshold voltage distribution associated with the group of the memory cells via an interpolation process using the determined quantities of memory cells associated with each of the different soft data values.

26. The apparatus of claim 25, wherein the controller is on a same semiconductor die as the array.

27. The apparatus of claim 25, wherein the controller is on a different semiconductor die than the array.

28. The apparatus of claim 25, wherein the controller includes circuitry on a same semiconductor die as the array and circuitry on a different semiconductor die than the array.

29. The apparatus of claim 25, wherein the controller includes the interpolation engine.

30. The apparatus of claim 25, wherein the interpolation process is a linear interpolation process.

31. The apparatus of claim 25, wherein the interpolation process is a polynomial interpolation process.

32. The apparatus of claim 25, wherein the interpolation process is a cubic spline interpolation process.

33. An apparatus, comprising:
an array of memory cells; and
a controller coupled to the array and configured to:
determine, using a number of sensing voltages spaced apart by a voltage amount, soft data for a group of the memory cells each programmed to one of a number of data states, wherein the soft data comprises a number of different soft data values;
determine a quantity of memory cells associated with each of the different soft data values;
normalize the determined quantities of memory cells associated with each of the different soft data values;
assign a threshold voltage value to represent each of the spacings between the sensing voltages; and
perform an interpolation process using the threshold voltage values assigned to represent the spacings between the sensing voltages and the normalized quantities of memory cells associated with each of the different soft data values to infer at least a portion of a threshold voltage distribution curve associated with the group of the memory cells.

34. The apparatus of claim 33, wherein the controller includes:
a histogram builder configured to determine the quantity of memory cells associated with each of the different soft data values;
a normalization engine configured to normalize the determined quantities of memory cells associated with each of the different soft data values;
an interpretation engine configured to assign the threshold voltage values to represent the spacings between the sensing voltages; and
an interpolation engine configured to perform the interpolation process using the threshold values assigned to represent the spacings between the sensing voltages and the normalized quantities of memory cells associated with each of the different soft data values to infer at least the portion of the threshold voltage distribution curve associated with the group of the memory cells.

35. The apparatus of claim 33, wherein the controller is configured to:
determine the quantity of memory cells associated with each of the different soft data values by creating a histogram for each of the different soft data values, wherein a height of each histogram corresponds to the quantity of memory cells associated with the soft data value for that particular histogram; and
normalize the determined quantities of memory cells associated with each of the different soft data values by adjusting the heights of a number of the histograms such that a weight of the quantities of memory cells associated with each of the different soft data values is equal, wherein the height of each histogram after adjusting the heights of the number of the histograms corresponds to the normalized quantities of memory cells associated with each of the different soft data values.

36. The apparatus of claim 35, wherein adjusting the heights of the number of the histograms includes decreasing the heights of the number of the histograms.

37. The apparatus of claim 33, wherein a number of the number of sensing voltages are spaced apart by different voltage amounts.

38. The apparatus of claim 37, wherein:
a first and a second of the number sensing voltages are spaced apart by a first voltage amount;
the second and a third of the number of sensing voltages are spaced apart by a second voltage amount that is different than the first voltage amount;
the third and a fourth of the number of sensing voltages are spaced apart by the second voltage amount; and
the fourth and a fifth of the number of sensing voltages are spaced apart by the first voltage amount.

39. The apparatus of claim 33, wherein each of the number of sensing voltages are spaced apart by different voltage amounts.

* * * * *